(12) United States Patent
Kanakasabapathy

(10) Patent No.: US 8,455,364 B2
(45) Date of Patent: Jun. 4, 2013

(54) SIDEWALL IMAGE TRANSFER USING THE LITHOGRAPHIC STACK AS THE MANDREL

(75) Inventor: Sivananda K. Kanakasabapathy, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 367 days.

(21) Appl. No.: 12/613,682

(22) Filed: Nov. 6, 2009

(65) Prior Publication Data

US 2011/0111596 A1 May 12, 2011

(51) Int. Cl.
*H01L 21/302* (2006.01)

(52) U.S. Cl.
USPC ........... 438/736; 438/689; 438/694; 438/696; 438/712; 438/717; 438/737; 438/738; 216/41; 216/67; 216/72

(58) Field of Classification Search
None
See application file for complete search history.

(56) References Cited

U.S. PATENT DOCUMENTS

| | | | |
|---|---|---|---|
| 5,283,208 A | 2/1994 | Lorsung et al. | 437/228 |
| 5,795,830 A | 8/1998 | Cronin et al. | 438/696 |
| 6,218,292 B1* | 4/2001 | Foote | 438/636 |
| 6,713,835 B1 | 3/2004 | Horak et al. | 257/522 |
| 6,774,437 B2 | 8/2004 | Bryant et al. | 257/350 |
| 6,777,809 B2 | 8/2004 | Duncombe et al. | 257/759 |
| 6,875,703 B1 | 4/2005 | Furukawa et al. | 438/736 |
| 6,949,458 B2 | 9/2005 | Conrad et al. | 438/637 |
| 6,960,510 B2 | 11/2005 | Deshpande et al. | 438/286 |
| 7,270,931 B2 | 9/2007 | Angelopoulos et al. | 430/270.1 |
| 7,351,666 B2 | 4/2008 | Furukawa et al. | 438/736 |
| 7,381,655 B2 | 6/2008 | Furukawa et al. | 438/736 |
| 2004/0198030 A1* | 10/2004 | Buehrer et al. | 438/585 |
| 2007/0049011 A1* | 3/2007 | Tran | 438/637 |
| 2007/0066009 A1 | 3/2007 | Furukawa et al. | 438/240 |
| 2007/0106972 A1 | 5/2007 | Liebmann et al. | 716/21 |
| 2007/0138526 A1* | 6/2007 | Tran et al. | 257/296 |
| 2007/0190713 A1 | 8/2007 | Doris et al. | 438/199 |
| 2007/0215960 A1 | 9/2007 | Zhu et al. | 257/414 |
| 2007/0259291 A1 | 11/2007 | Bucchignano et al. | 430/313 |
| 2008/0076070 A1* | 3/2008 | Koh et al. | 430/311 |
| 2008/0122125 A1* | 5/2008 | Zhou | 257/797 |
| 2008/0206996 A1 | 8/2008 | Furukawa et al. | 438/694 |
| 2008/0286971 A1 | 11/2008 | Doris et al. | 438/694 |
| 2009/0047791 A1 | 2/2009 | Dobuzinsky et al. | 438/705 |
| 2009/0065876 A1 | 3/2009 | Chang et al. | 257/410 |
| 2009/0101995 A1 | 4/2009 | Beintner et al. | 257/412 |
| 2009/0124097 A1 | 5/2009 | Cheng | 438/792 |
| 2009/0194503 A1 | 8/2009 | Ko et al. | 216/47 |
| 2009/0200636 A1 | 8/2009 | Edelstein et al. | 257/522 |

OTHER PUBLICATIONS

L. Liou et al., Journal of Electrochemical Society, vol. 131, 1984, pp. 672-674.*

U.S. Appl. No. 12/583,993, filed Aug. 28, 2009, Chung-Hsun Lin et al., 23 pgs.

* cited by examiner

*Primary Examiner* — Lan Vinh
*Assistant Examiner* — Jiong-Ping Lu
(74) *Attorney, Agent, or Firm* — Harrington & Smith; Louis J. Percello

(57) ABSTRACT

In one non-limiting exemplary embodiment, a method includes: providing a structure having at least one lithographic layer on a substrate, where the at least one lithographic layer includes a planarization layer (PL); forming a sacrificial mandrel by patterning at least a portion of the at least one lithographic layer using a photolithographic process, where the sacrificial mandrel includes at least a portion of the PL; and producing at least one microstructure by using the sacrificial mandrel in a sidewall image transfer process.

20 Claims, 12 Drawing Sheets

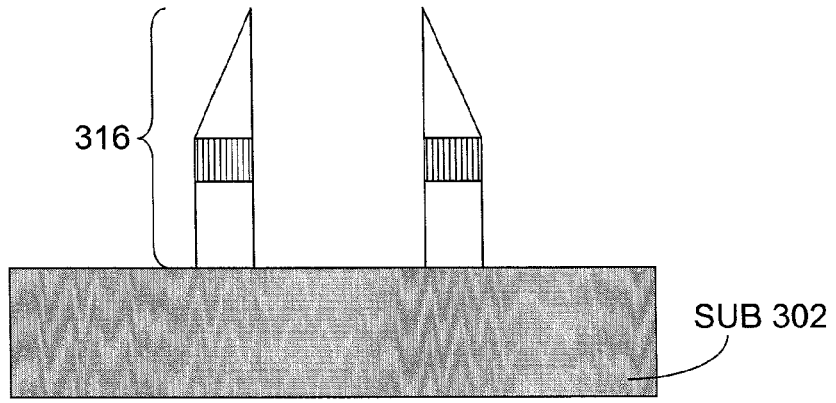

FIG. 23

```
┌─────────────────────────────────────────────┐
│ PROVIDING A STRUCTURE COMPRISING AT LEAST   │─401
│ ONE LITHOGRAPHIC LAYER ON A SUBSTRATE,      │
│ WHERE THE AT LEAST ONE LITHOGRAPHIC LAYER   │
│ COMPRISES A PLANARIZATION LAYER (PL)        │
└─────────────────────────────────────────────┘
                      │
                      ▼
┌─────────────────────────────────────────────┐
│      FORMING A SACRIFICIAL MANDREL BY       │─402
│  PATTERNING AT LEAST A PORTION OF THE AT    │
│    LEAST ONE LITHOGRAPHIC LAYER USING A     │
│    PHOTOLITHOGRAPHIC PROCESS, WHERE THE     │
│  SACRIFICIAL MANDREL COMPRISES AT LEAST A   │
│              PORTION OF THE PL              │
└─────────────────────────────────────────────┘
                      │
                      ▼
┌─────────────────────────────────────────────┐
│ PRODUCING AT LEAST ONE MICROSTRUCTURE BY    │─403
│ USING THE SACRIFICIAL MANDREL IN A SIDEWALL │
│         IMAGE TRANSFER PROCESS              │
└─────────────────────────────────────────────┘
```

FIG. 24

SIDEWALL IMAGE TRANSFER USING THE LITHOGRAPHIC STACK AS THE MANDREL

TECHNICAL FIELD

The exemplary embodiments of this invention relate generally to photolithography and, more specifically, relate to sidewall image transfer techniques and processes and products formed thereby.

BACKGROUND

The following abbreviations are utilized herein:
ALD atomic layer deposition
ARC antireflective coating
BEOL back end of line
BoX buried oxide
CD critical dimension
CMOS complementary metal-oxide semiconductor
COO cost of ownership
CVD chemical vapor deposition
FET field effect transistor
HM hardmask
MLD multilayer deposition
NFC near frictionless carbon
OPL organic planarization layer
PC photonic crystal
PD pitch doubling
PECVD plasma enhanced chemical vapor deposition
PR photoresist
RIE reactive ion etch
SOI silicon-on-insulator
SIT sidewall image transfer
STI shallow trench isolation Photolithography is a technique for transferring an image rendered on one media onto another media photographically. Photolithography techniques are widely used in semiconductor fabrication. Typically, a circuit pattern is rendered as a positive or negative mask image which is then projected onto a silicon substrate coated with photosensitive materials (e.g., PR). Radiation impinges on the masked surface to chemically change those areas of the coating exposed to the radiation, usually by polymerizing the exposed coating. The unpolymerized areas are removed, being more soluble in the developer than the polymerized regions, and the desired image pattern remains.

Semiconductors and integrated circuit chips have become ubiquitous within many products due to their continually decreasing cost and size. In the microelectronics industry as well as in other industries involving construction of microscopic structures (e.g., micromachines, magnetoresistive heads, etc.) there is a continued desire to reduce the size of structural features and microelectronic devices and/or to provide a greater amount of circuitry for a given chip size. Miniaturization in general allows for increased performance (more processing per clock cycle and less heat generated) at lower power levels and lower cost. Present technology is at or approaching atomic level scaling of certain micro-devices such as logic gates, FETs and capacitors, for example. Circuit chips with hundreds of millions of such devices are not uncommon. Further size reductions appear to be approaching the physical limit of trace lines and micro-devices that are embedded upon and within their semiconductor substrates. The present invention is directed to such micro-sized devices.

Effective lithographic techniques are essential for achieving reduction of feature sizes. Lithography impacts the manufacture of microscopic structures, not only in terms of directly imaging patterns on the desired substrate, but also in terms of making masks typically used in such imaging. Typical lithographic processes involve formation of a patterned resist layer by patternwise exposing a radiation-sensitive resist to an imaging radiation. The image is subsequently developed by contacting the exposed resist layer with a material (typically an aqueous alkaline developer) to selectively remove portions of the resist layer to reveal the desired pattern. The pattern is subsequently transferred to an underlying material by etching the material in openings of the patterned resist layer. After the transfer is complete, the remaining resist layer is removed.

For some lithographic imaging processes, the resist used does not provide sufficient resistance to subsequent etching steps to enable effective transfer of the desired pattern to a layer underlying the resist. In many instances (e.g., where an ultrathin resist layer is desired, where the underlying material to be etched is thick, where a substantial etching depth is required and/or where it is desired to use certain etchants for a given underlying material), a so-called HM layer is used intermediate between the resist layer and the underlying material to be patterned by transfer from the patterned resist. The HM layer receives the pattern from the patterned resist layer and should be able to withstand the etching processes needed to transfer the pattern to the underlying material.

Also, where the underlying material layer is excessively reflective of the imaging radiation used to pattern the resist layer, a thin ARC is typically applied between the underlying layer and the resist layer. In some instances, the ARC and HM functions may be served by a same material. In other cases, an OPL may be used as a softmask. The OPL serves two roles. First, the OPL helps define the depth of focus by ensuring smooth planarization. Second, the OPL acts as an ARC to reduce or prevent reflections of the incident laser beam. Other liquid or viscous films may be utilized instead of an OPL to achieve similar performance. One non-limiting example of an OPL is ODL.

Basically, a FET is a transistor having a source, a gate, and a drain. The action of the FET depends on the flow of majority carriers along a channel between the source and drain that runs past the gate. Current through the channel, which is between the source and drain, is controlled by the transverse electric field under the gate. More than one gate (multi-gate) can be used to more effectively control the channel. The length of the gate determines how fast the FET switches, and can be about the same as the length of the channel (i.e., the distance between the source and drain). Multi-gate FETs are considered to be promising candidates to scale CMOS FET technology down to the sub-22 nm regime.

The size of FETs has been successfully reduced through the use of one or more fin-shaped channels. A FET employing such a channel structure may be referred to as a FinFET. Previously, CMOS devices were substantially planar along the surface of the semiconductor substrate, the exception being the FET gate that was disposed over the top of the channel. Fins break from this paradigm by using a vertical channel structure in order to maximize the surface area of the channel that is exposed to the gate. The gate controls the channel more strongly because it extends over more than one side (surface) of the channel. For example, the gate can enclose three surfaces of the three-dimensional channel, rather than being disposed only across the top surface of the traditional planar channel.

Device parameters of FinFETs are extremely sensitive to semiconductor fin thickness. In order to realize the full potential of a FinFET, the silicon fin must be very thin (e.g., on the same order of thickness as that of a fully-depleted SOI). Similarly, line width control problems during gate electrode definition for small devices can lead to performance degradation, power consumption control issues and yield loss. Previously, lithographic techniques have been used to form device components (e.g., semiconductor fins for FinFETs, gate electrodes, etc.) in a substrate. For example, using photolithography a feature can be printed directly into a photoresist layer and the image can be transferred into an underlying film. However, current state-of-the-art lithographic technology cannot adequately and efficiently satisfy the ever-increasing demand for smaller devices and device components. Thus, the requirement for very thin, replicable, device components has re-awakened interest in SIT to form such components.

SIT involves the usage of a sacrificial structure (e.g., a mandrel, typically composed of a polycrystalline silicon). A sidewall spacer (such as silicon dioxide or silicon nitride, Si3N4, for example) having a thickness less than that permitted by the current ground rules is formed on the sides of the mandrel (e.g., via oxidization or film deposition and etching). After removal of the mandrel, the remaining sidewall spacer is used as a HM to etch the layer(s) below, for example, with a directional RIE. Since the sidewall has a (sublithographic) width less than the ground rules, the structure formed in the layer below will also have a sublithographic width. In other uses, the sidewall may be used as a component in the desired structure (e.g., as a portion of the fins in a FinFET).

One exemplary additive SIT process is as follows. A mandrel (e.g., a narrow band) is defined across a hard mask on a substrate. Specifically, a multi-layer stack comprising, for example, a substrate with underlying polysilicon for FET gate patterning, a thin dielectric (e.g., nitride) hard mask layer, a thick mandrel (e.g., a polysilicon) layer, and a mandrel mask layer, is patterned and etched using standard lithographic techniques to form the mandrel with vertical walls above the hard mask layer. Then, spacers are formed on the hard mask adjacent to the walls of the mandrels (e.g., by depositing a thin conformal oxide or nitride layer and performing an anisotropic etch to remove the conformal oxide or nitride layer from the top of the mandrel layer and from horizontal surfaces). The spacer thickness is chosen to be the same as that of the desired width of the final shape (factoring in any etch film erosion). Thus, spacers are formed on the vertical walls of a mandrel and these spacers determine the final pattern widths and tolerances of the components being formed in the substrate. The spacer pattern image created from the walls of the mandrel is then transferred (e.g., by RIE) into the hard mask on the substrate. The hard mask is used to pattern the components (e.g., fins, gates, etc.) in the substrate.

In some cases, the sidewall material may be selected to deposit conformally in order to maintain a desired width and to be etch resistant (i.e., to act as a HM). In some cases, the layer below may be selected to have appropriate electrical properties (e.g., in accordance with the desired product). As a non-limiting example, the layer below may comprise polycrystalline silicon.

Further reference with regards to SIT processes and techniques may be made to commonly-assigned U.S. Pat. No. 7,381,655 to Furukawa et al. and commonly-assigned U.S. Patent Application Publication No. 2007/0066009 by Furukawa et al., both of which are incorporated by reference herein in their entireties.

SUMMARY

In one exemplary embodiment of the invention, a method comprising: providing a structure comprising at least one lithographic layer on a substrate, where the at least one lithographic layer comprises a planarization layer (PL); forming a sacrificial mandrel by patterning at least a portion of the at least one lithographic layer using a photolithographic process, where the sacrificial mandrel comprises at least a portion of the PL; and producing at least one microstructure by using the sacrificial mandrel in a sidewall image transfer process.

BRIEF DESCRIPTION OF THE DRAWINGS

The foregoing and other aspects of embodiments of this invention are made more evident in the following Detailed Description, when read in conjunction with the attached Drawing Figures, wherein:

FIGS. 18-23 show a third exemplary embodiment of the invention whereby portions of another exemplary litho stack are utilized to form the mandrel for a SIT process;

FIG. 24 depicts a flowchart illustrating one non-limiting example of a method for practicing the exemplary embodiments of this invention;

DETAILED DESCRIPTION

Figure 1:
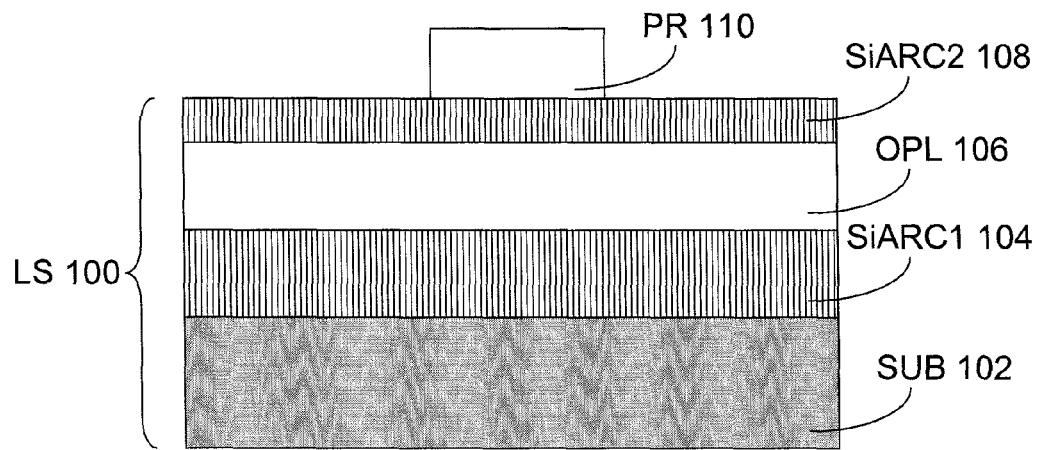
FIGS. 1-8 illustrate a first exemplary embodiment of the invention whereby portions of an exemplary litho stack are utilized to form the mandrel for a SIT process.

Pitch doubling (i.e., spatial frequency doubling) will likely become ubiquitous as semiconductor production focuses on smaller sizes (e.g., 22 nm or smaller). What is needed is a lithographic (litho) level agnostic pitch doubling scheme with a low COO. Since the spacer sets the CD, very tight control of conformality and deposition thickness is needed.

Current SIT techniques utilize a poly (polycrystalline silicon) mandrel. The SiN spacer is deposited (e.g., using PECVD) around the poly mandrel. The mandrel is removed and the remaining spacer is used as a mask for lower levels (e.g., the spacer image is transferred down to the lower levels). This process tends to necessitate usage of high temperatures for the poly. These high temperatures are not compatible with BEOL levels. In addition, the COO is higher because of the sacrificial mandrel deposition (i.e., deposition of mandrel layers, used for forming the sacrificial mandrel).

In view of the foregoing, the exemplary embodiments of the invention provide novel techniques that directly avail the litho stack for mandrel definition. That is, instead of depositing one or more mandrel layers (e.g., one or more layers of poly expressly for the mandrel) that are subsequently defined and sacrificed, the exemplary embodiments use the litho stack itself (e.g., the OPL) to define and form the sacrificial mandrel. By implication, this avoids the otherwise necessary higher temperature processes and enables usage of very low temperatures for the spacer deposition process. Furthermore, the lower temperature, atomic layer control and conformality enable usage of MLD or ALD.

Thus, the exemplary embodiments of the invention disclosed herein provide a patterning method for forming one or more discrete components in a substrate. As a non-limiting example, the exemplary embodiments of the method can be used to form narrow fins for a finFET or narrow gate electrodes to contact a dielectric layer (e.g., a gate dielectric layer) above an active silicon region (e.g., an active silicon region in a buried oxide substrate layer or an active silicon region isolated by STI structures). Exemplary embodiments of the method incorporate the use of SIT techniques (e.g., additive or subtractive SIT techniques) to create a pattern in a mask. The patterned mask is then used to transfer the image into the substrate (e.g., by using a directional etching process, such as directional RIE) to form the one or more components.

The exemplary embodiments of the invention and the various features and advantageous details thereof will be explained more fully with reference to the non-limiting exemplary embodiments that are illustrated in the accompanying drawings and detailed in the following description. It should be noted that the features illustrated in the drawings are not necessarily drawn to scale. Descriptions of well-known components and processing techniques (e.g., as known to one of ordinary skill in the art) are omitted so as to avoid unnecessarily obscuring the exemplary embodiments of the invention. The examples used herein are intended merely to facilitate an understanding of ways in which the exemplary embodiments of the invention may be practiced and to further enable those of ordinary skill in the art to practice the exemplary embodiments of the invention. Accordingly, the examples described herein should not be construed as limiting the scope of the exemplary embodiments of the invention.

FIGS. 1-8 illustrate a first exemplary embodiment of the invention whereby portions of an exemplary litho stack are utilized to form the mandrel for a SIT process. FIG. 1 shows an exemplary litho stack (LS) 100 comprised of, in order from lower layers to upper layers: a substrate (SUB) 102, a first or bottom silicon-containing ARC layer (SiARC1) 104, an OPL 106 and a second or top silicon-containing ARC layer (SiARC2) 108. As a non-limiting example, and for purposes that will become apparent below, it may be desirable for the bottom SiARC1 104 to be thicker than the top SiARC2 108. As a further non-limiting example, the bottom SiARC1 104 may have a thickness of about 70 nm, while the top SiARC2 108 may have a thickness of about 35 nm.

Note that the LS 100 illustrated in FIG. 1 is merely an example, and that further exemplary embodiments may include additional layers, fewer layers and/or a different arrangement of layers. Further note that there is no mandrel deposition. That is, no mandrel-specific layers or materials are required or used. All of the LS 100 layers shown in FIG. 1 are layers that might otherwise be present in a conventional litho stack for other (i.e., non-mandrel related) purposes.

Figure 2:
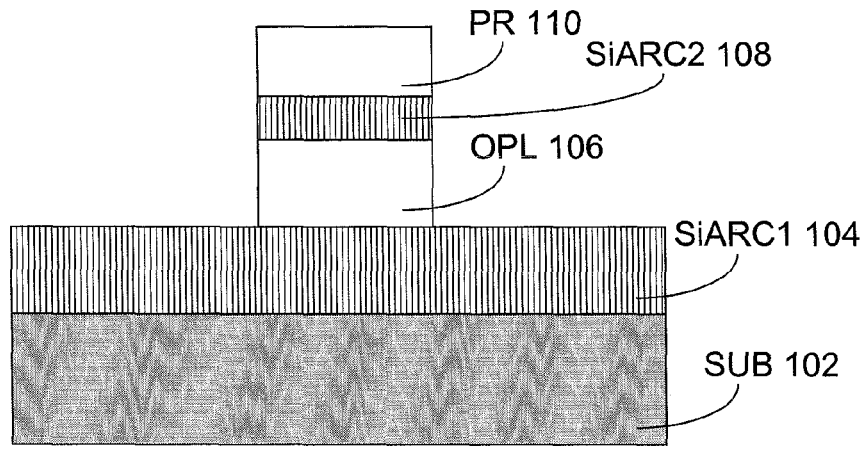
Figure 3:
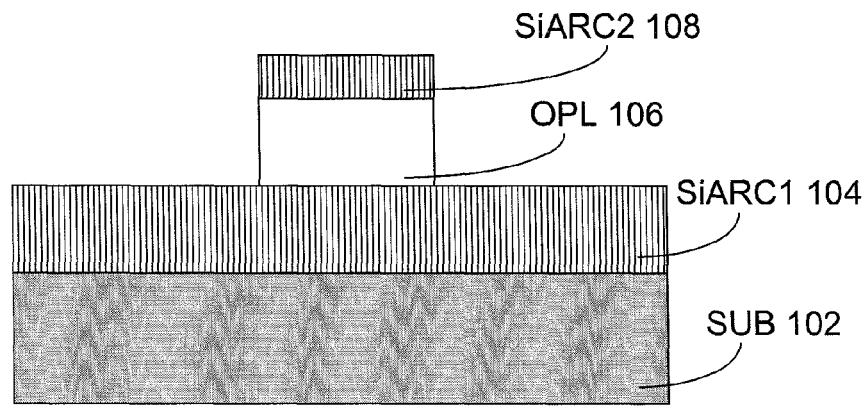

Also shown in FIG. 1 is a photosensitive material, such as a photoresist (PR) 110, that will be used to pattern the layers beneath it. The PR 110 is used, at least in part, to form the mandrel (MAN) 101 (see FIG. 4) by defining the shape of the layers below it (FIG. 2). This may be performed using conventional photolithography techniques. The PR 110 is then removed leaving the patterned layers of SiARC2 108 and OPL 106 (FIG. 3).

Figure 4:
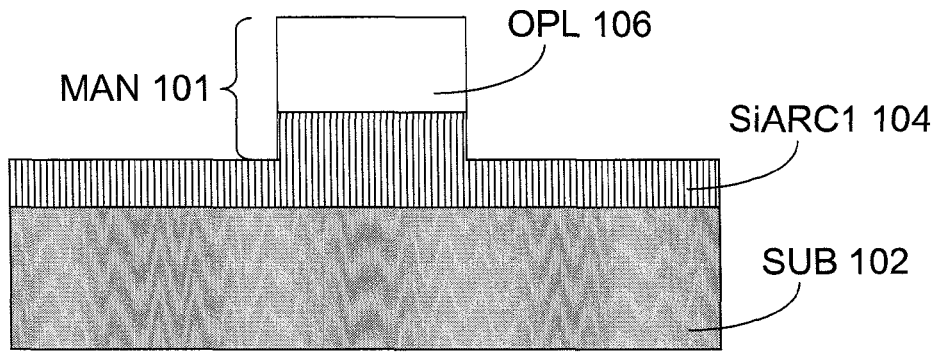

Next, an SiARC etch is performed to remove the top SiARC2 108 (FIG. 4). As noted above, since the bottom SiARC1 104 is thicker than the top SiARC2 108, a protective coating of the bottom SiARC1 104 (protecting the SUB 102) will remain after the etch while the entirety of the top SiARC2 108 is removed (having served its purpose for the initial radiation bombardment).

Figure 5:
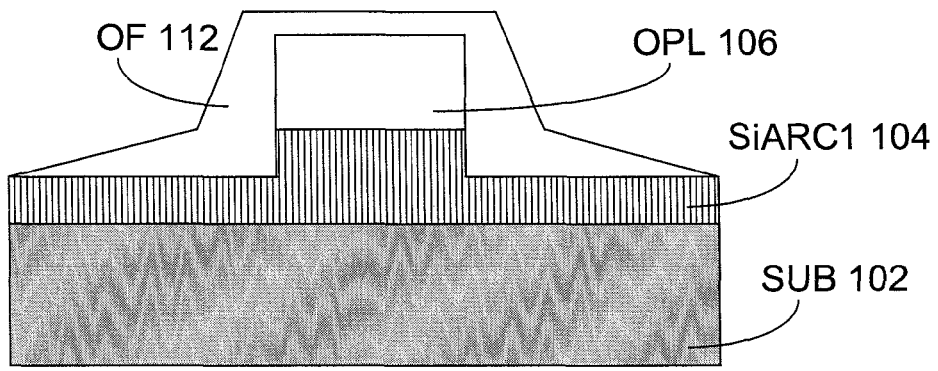
Figure 6:
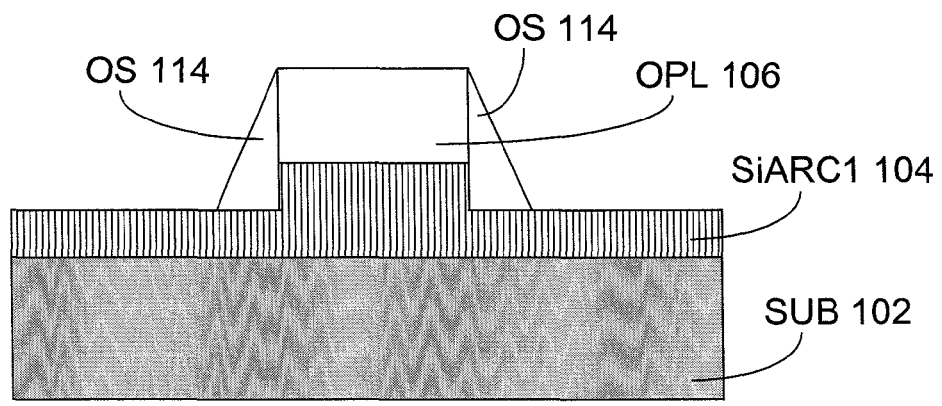
Figure 7:
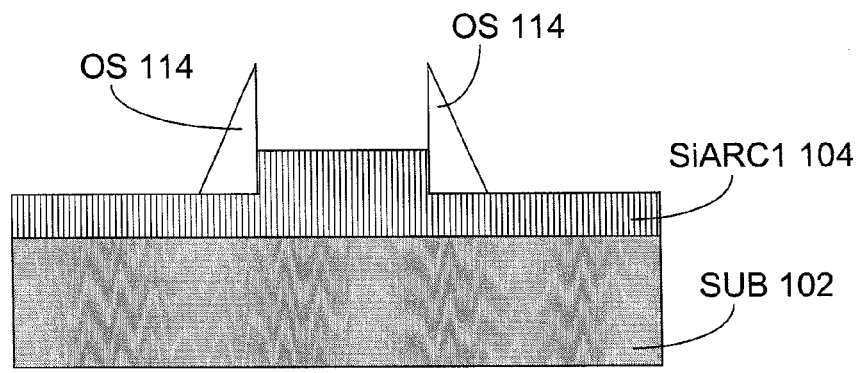
Figure 8:
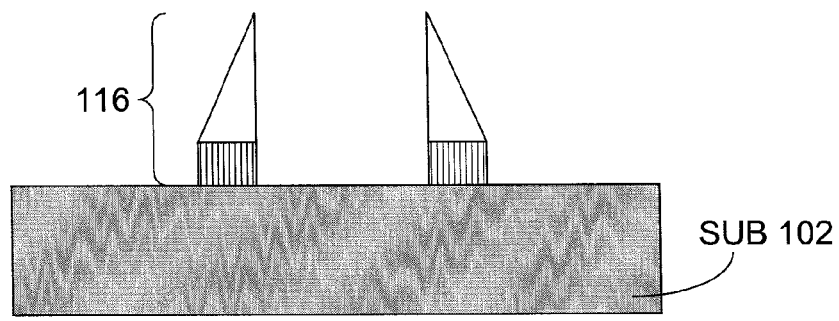

The remainder of OPL 106 and a portion of the SiARC1 104 below the OPL 106 form the MAN 101. The MAN 101 is used in conjunction with a conventional SIT process to form oxide spacers (OS) 114 (see FIG. 6). First, an oxide film (OF) 112 is deposited over the structure (FIG. 5). Second, an anisotropic etch is performed to remove the conformal oxide layer from the top of the mandrel layer and from horizontal surfaces, resulting in the formation of OS 114 around the MAN 101 (FIG. 6). The OPL 106 is removed (FIG. 7), after which the remaining SiARC1 104 (i.e., those portions that are not masked by the OS 114) are etched away (FIG. 8). As with conventional SIT processes, this results in a structure 116 (e.g., comprised of the OS 114 and a small portion of the SiARC1 104) that can be used as a mask or a transfer layer for transferring the pattern to the below layers (e.g., SUB 102).

Figure 9:
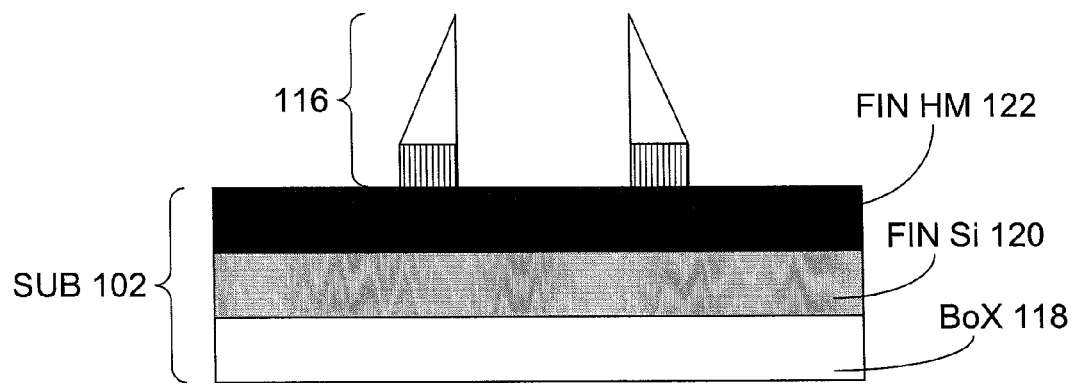
FIGS. 9-12 show an example of how the resulting structure 116 of FIG. 8 can be used as a mask for patterning the layers (e.g., of the substrate) below the structure 116.

FIGS. 9-12 show an example of how the resulting structure 116 (of FIG. 8) can be used as a mask (e.g., a softmask) for patterning the layers (e.g., of the substrate) below the structure 116. For the purposes of this example, and as shown in FIG. 9, the SUB 102 is comprised of, in order from lower layers to upper layers: a buried oxide layer (BoX) 118, a fin silicon layer (FIN Si) 120 and a fin hardmask layer (FIN HM 122). As non-limiting examples, the FIN HM 122 may comprise a thermal oxide, a silicon oxide, a silicon nitride or a silicon carbo nitride.

Figure 10:
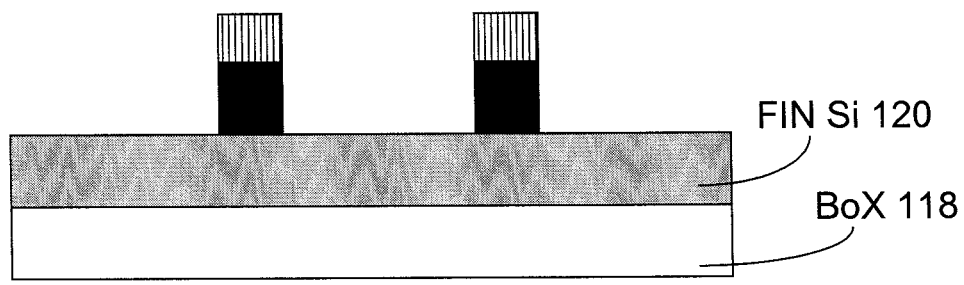
Figure 11:
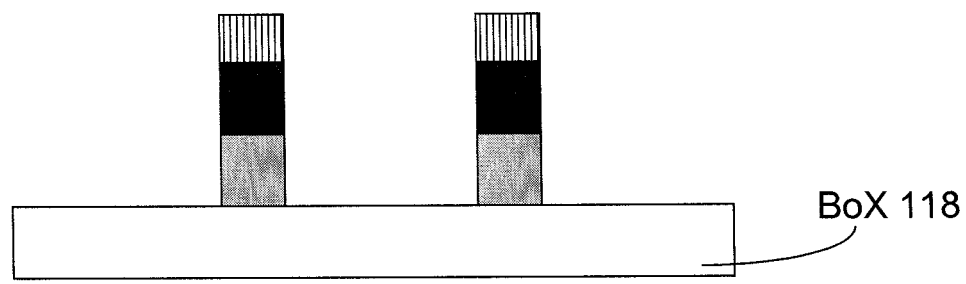
Figure 12:
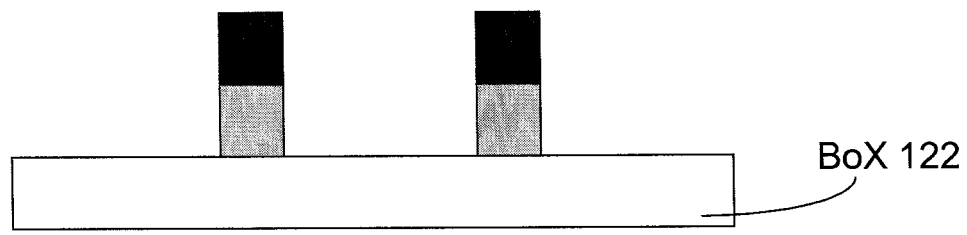

First, the OS 114 is removed during the FIN HM 122 etch (FIG. 10). Next, the structure is etched into the FIN Si 120 (FIG. 11). Lastly, the remaining portion of SiARC1 104 is removed (FIG. 12). This results in a transfer of the shape of the structure 116 into the FIN HM 122 and FIN Si 120 which are disposed on the BoX 118. These transfer steps may be performed using conventional techniques that are known to one of ordinary skill in the art.

Figure 13:
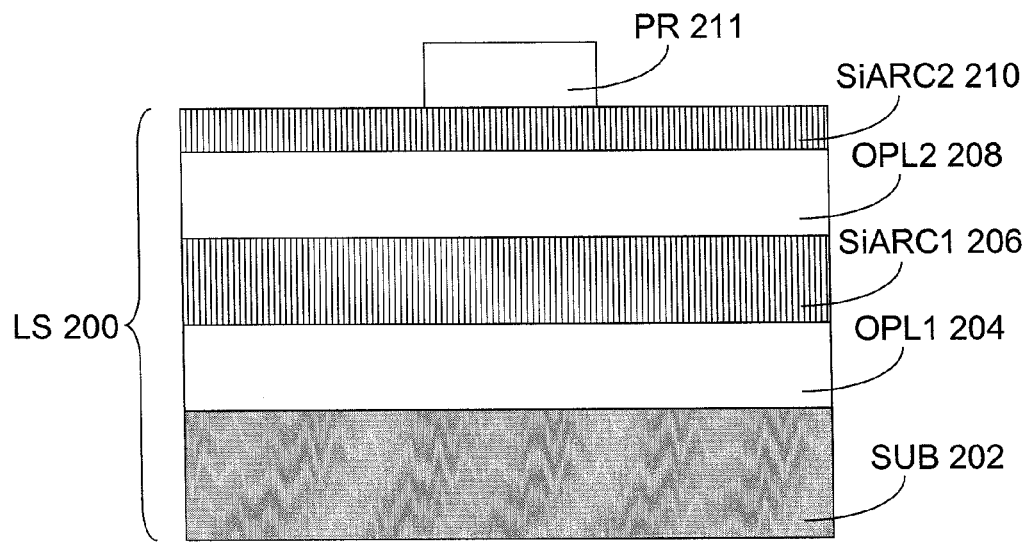
FIGS. 13-17 depict a second exemplary embodiment of the invention whereby portions of another exemplary litho stack are utilized to form the mandrel for a SIT process.

FIGS. 13-17 depict a second exemplary embodiment of the invention whereby portions of another exemplary litho stack are utilized to form the mandrel for a SIT process. FIG. 13 shows another exemplary litho stack (LS) 200 comprised of, in order from lower layers to upper layers: a substrate (SUB) 202, a first or bottom OPL1 204, a first or bottom silicon-containing ARC layer (SiARC1) 206, a second or top OPL2 208 and a second or top silicon-containing ARC layer (SiARC2) 210. As a non-limiting example, and for purposes that will become apparent below, it may be desirable for the bottom SiARC1 206 to be thicker than the top SiARC2 210. As a further non-limiting example, the bottom SiARC1 206 may have a thickness of about 70 nm, while the top SiARC2 210 may have a thickness of about 35 nm.

Note that the LS 200 illustrated in FIG. 13 is merely an example, and that further exemplary embodiments may include additional layers, fewer layers and/or a different arrangement of layers. Further note that there is no mandrel deposition. That is, no mandrel-specific layers or materials are required or used.

Figure 14:
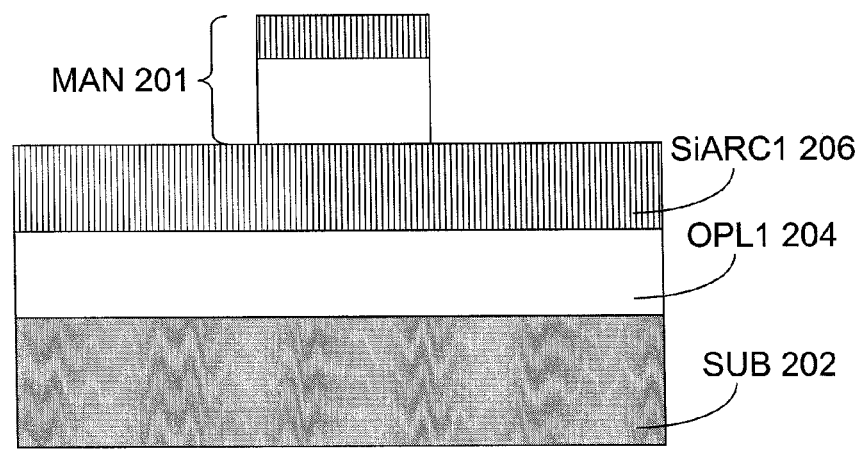

Also shown in FIG. 13 is a photosensitive material, such as a photoresist (PR) 211, that is used to form the mandrel (MAN) 201 (FIG. 14) by defining the shape of the layers below. This may be performed using conventional photolithography techniques. The PR 211 is then removed leaving the patterned layers of SiARC2 210 and OPL2 208 (FIG. 14). Note that the MAN 201 of the second exemplary embodiment comprises layers of OPL and SiARC but in a reverse order as compared to the first exemplary embodiment (see MAN 101 in FIG. 4).

Figure 15:
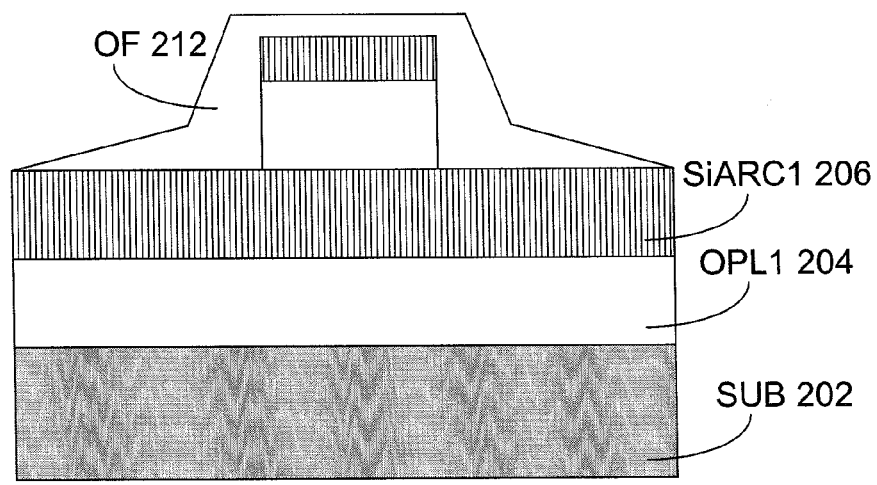
Figure 16:
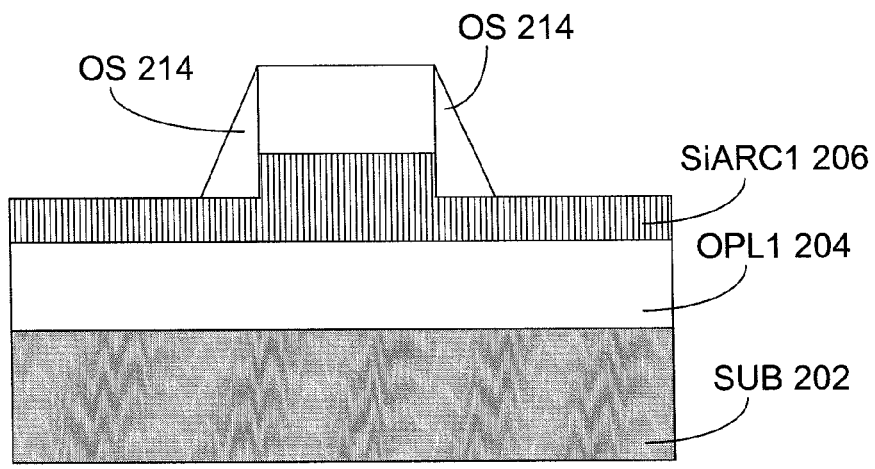
Figure 17:
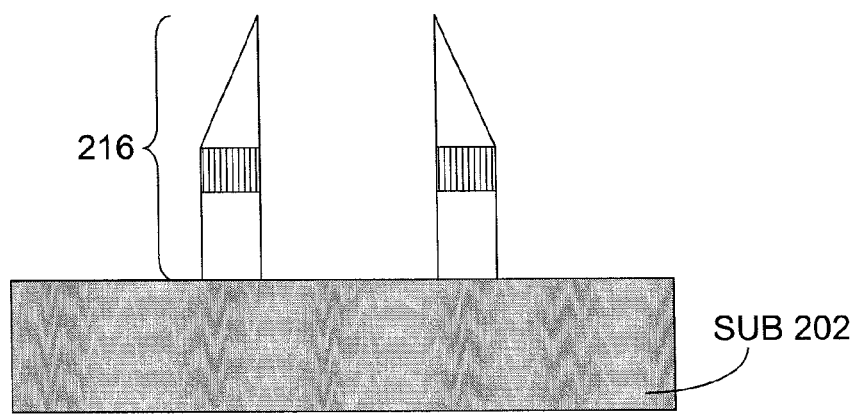

In contrast to the first exemplary embodiment, the second exemplary embodiment does not perform an SiARC etch prior to deposition of the oxide film. The oxide film (OF) 212 is deposited without first stripping the SiARC2 210 (FIG. 15). The SiARC is subsequently stripped during the oxide spacer etch which forms the oxide spacers (OS) 214 (FIG. 16). As noted above, since the bottom SiARC1 206 is thicker than the top SiARC2 210, a coating of the bottom SiARC1 206 will remain after the etch while the entirety of the top SiARC2 210 is removed. The remaining mandrel portion of the OPL2 208 is removed and the SiARC1 206 and OPL1 204 are etched away, resulting in the final structure 216 disposed on the SUB 202 (FIG. 17). As with the first exemplary embodiment, the structure 216 (e.g., comprised of the OS 214 and small portions of the SiARC1 206 and the OPL1 204) can be used as a mask or a transfer layer for transferring the pattern to other layers (e.g., SUB 202).

Figure 18:
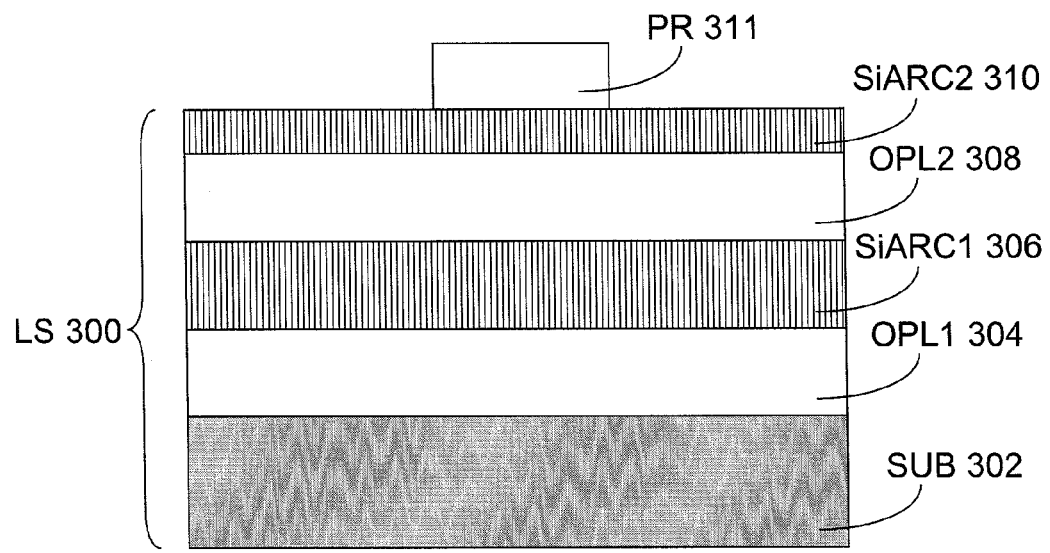

FIGS. 18-23 show a third exemplary embodiment of the invention whereby portions of an exemplary litho stack are utilized to form the mandrel for a SIT process. FIG. 18 shows another exemplary litho stack (LS) 300 comprised of, in order from lower layers to upper layers: a substrate (SUB) 302, a first or bottom OPL1 304, a first or bottom silicon-containing ARC layer (SiARC1) 306, a second or top OPL2 308 and a second or top silicon-containing ARC layer (SiARC2) 310. As a non-limiting example, and for purposes that will become apparent below, it may be desirable for the bottom SiARC1 306 to be thicker than the top SiARC2 310. As a further non-limiting example, the bottom SiARC1 306 may have a thickness of about 70 nm, while the top SiARC2 310 may have a thickness of about 35 nm.

Note that the LS 300 illustrated in FIG. 18 is merely an example, and that further exemplary embodiments may include additional layers, fewer layers and/or a different arrangement of layers. Further note that there is no mandrel deposition. That is, no mandrel-specific layers or materials are required or used.

Figure 19:
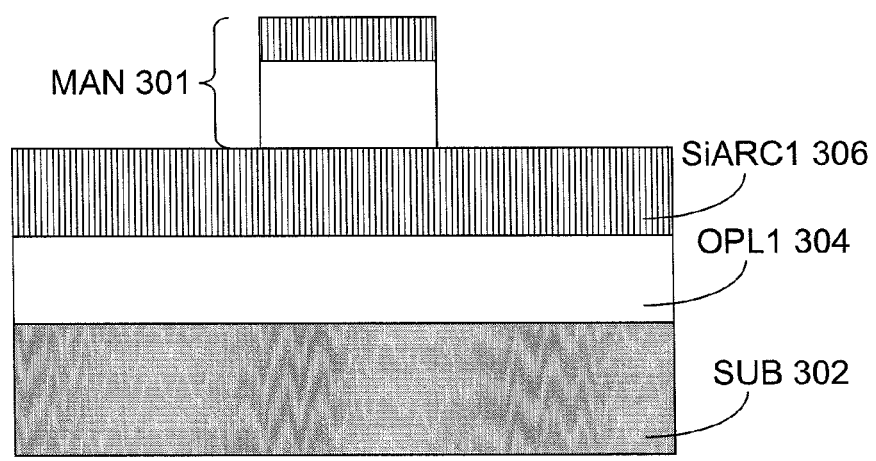

Also shown in FIG. 18 is a photosensitive material, such as a photoresist (PR) 311, that is used to form the mandrel (MAN) 301 (See FIG. 20) by defining the shape of the layers below. This may be performed using conventional photolithography techniques. The PR 311 is then removed leaving the patterned layers of SiARC2 310 and OPL2 308 (FIG. 19).

Figure 20:
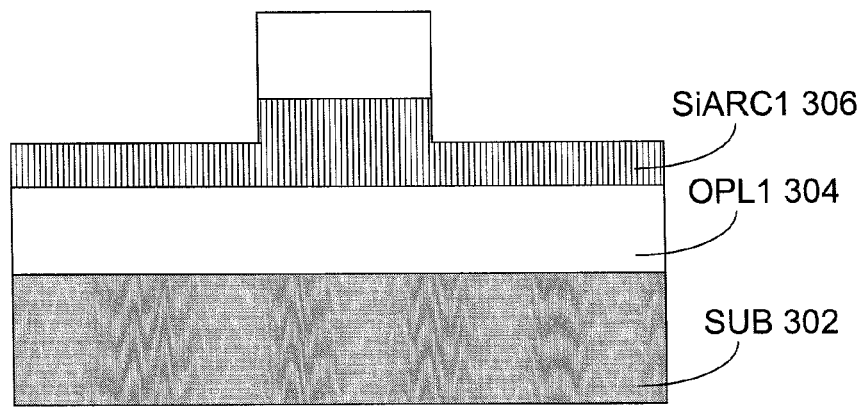

In contrast to the second exemplary embodiment, the third exemplary embodiment does perform an SiARC etch prior to deposition of the oxide film. The SiARC etch removes the top SiARC2 310 while leaving a coating of the bottom SiARC1 306, for example, due to the difference in thickness between the two SiARC layers (FIG. 20).

Figure 21:
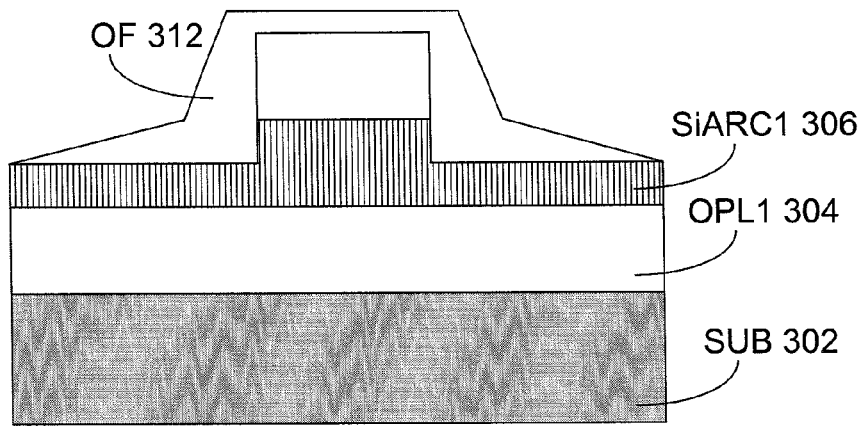
Figure 22:
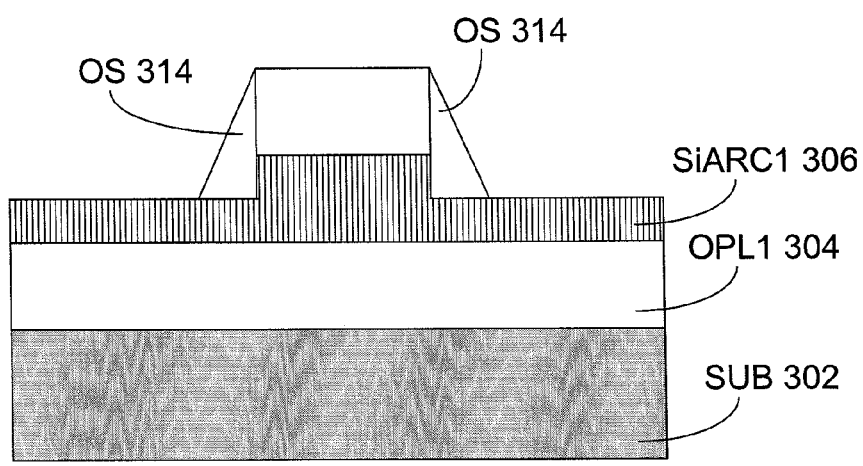

The remainder of OPL2 308 and a portion of the SiARC1 306 below the OPL2 308 form the MAN 301. The MAN 301 is used in conjunction with a conventional SIT process to form oxide spacers (OS) 314 (see FIG. 22). First, an oxide film (OF) 312 is deposited over the structure (FIG. 21). Second, an anisotropic etch is performed to remove the conformal oxide layer from the top of the mandrel layer and from horizontal surfaces, resulting in the formation of OS 314 around the MAN 301 (FIG. 22). The OPL2 308 is removed, after which the remaining SiARC1 306 (i.e., those portions that are not masked by the OS 314) is etched away and the remaining OPL1 304 (i.e., those portions that are not masked by the OS 314) is removed. This results in a final structure 316 similar to that of the second exemplary embodiment (see structure 216 in FIG. 17). As with the first exemplary embodiment, the structure 316 (e.g., comprised of the OS 314 and small portions of the SiARC1 306 and the OPL1 304) can be used as a mask or a transfer layer for transferring the pattern to other layers (e.g., SUB 302).

As noted above, the difference between the second exemplary embodiment and the third exemplary embodiment lies in the order in which the SiARC removal (etch) and oxide film deposition are performed. In the second exemplary embodiment, stripping the top SiARC2 210 during the oxide spacer etch may limit or affect the choice (e.g., material) of the oxide spacer, for example, in view of how the oxide spacer reacts with or to the SiARC stripping. The third exemplary embodiment may provide more flexibility (e.g., with respect to oxide spacer selection) since such considerations are rendered moot by having the SiARC stripped prior to the oxide film deposition (i.e., the oxide spacer cannot interact with the top SiARC2 310).

In accordance with the above-described exemplary embodiments of the invention, methods and techniques (e.g., for fabricating at least one sublithographic structure) are described wherein portions of the litho stack (e.g., portions of the OPL(s) and/or SiARC layers) are used to form the mandrel for a SIT process. This is advantageous in that it removes the mandrel deposition step (e.g., deposition of layers and/or materials specifically for the mandrel), essentially by combining it with the track's action of spinning on (coating) the ODL. Furthermore, this avoids the necessity of a higher temperature poly-related process and enables the usage of low temperature techniques and ALD-like processes. This further allows for resist stack compatibility, extending the processes and techniques to all line-space levels without thermal budget levels. While MLD is a generally slower process and requires track optimization for higher throughput, it is often batched for a high average throughput.

While described above with respect to certain materials and techniques, it should be appreciated that the exemplary embodiments of the invention are not limited thereto. As one non-limiting example, the mandrel may be formed using any suitable technique or process. As another non-limiting example, the mandrel may comprise different materials and/or a different arrangement of materials.

Below are further descriptions of various non-limiting, exemplary embodiments of the invention. The below-described exemplary embodiments are numbered separately for clarity purposes. This numbering should not be construed as entirely separating the various exemplary embodiments since aspects of one or more exemplary embodiments may be practiced in conjunction with one or more other aspects or exemplary embodiments.

(1) In one exemplary embodiment, and as illustrated in FIG. 24, a method comprising: providing a structure comprising at least one lithographic layer on a substrate, where the at least one lithographic layer comprises a planarization layer (PL) (401); forming a sacrificial mandrel by patterning at least a portion of the at least one lithographic layer using a photolithographic process, where the sacrificial mandrel comprises at least a portion of the PL (402); and producing at least one microstructure by using the sacrificial mandrel in a sidewall image transfer process (403).

A method as above, where the least one lithographic layer comprises: a first silicon-containing antireflective coating (SiARC1) overlying the substrate, the PL overlying the SiARC1 and a second silicon-containing antireflective coating (SiARC2) overlying the PL. A method as in any above, where forming the sacrificial mandrel comprises patterning the SiARC2 and the PL into a shape of the sacrificial mandrel and removing the SiARC2. A method as in any above, where removing the SiARC2 further comprises removing a total thickness of the SiARC2 and removing a portion of the SiARC1, where the removed portion of the SiARC1 has a thickness less than the total thickness of the SiARC1. A method as in any above, where a thickness of the SiARC1 is greater than a thickness of the SiARC2. A method as in any above, where the SiARC1 has a thickness of about 70 nanometers and the SiARC2 has a thickness of about 35 nanometers. A method as in any above, where the sidewall image transfer process comprises: depositing a film of oxide material and etching the oxide material to remove an oxide layer from a top surface of the mandrel and from other horizontal surfaces, where the etching results in formation of at least one oxide spacer having a desired shape of the microstructure. A method as in any above, where producing the at least one microstructure further comprises: after the etching, removing a remaining portion of the PL and performing another etching to remove exposed portions of the SiARC1. A method as in any above, where producing the at least one microstructure further comprises: patterning the substrate to form the at least one microstructure by using the at least one oxide spacer and a portion of the SiARC1 beneath the at least one oxide spacer as a mask, where the at least one microstructure comprises a portion of the substrate.

A method as in any above, where the PL comprises a second planarization layer (PL2), where the least one lithographic layer comprises: a first planarization layer (PL1) overlying the substrate, a first silicon-containing antireflective coating (SiARC1) overlying the PL1, the PL2 overlying the SiARC1 and a second silicon-containing antireflective coating (SiARC2) overlying the PL2. A method as in any above, where forming the sacrificial mandrel comprises patterning the SiARC2 and the PL2 into a shape of the sacrificial mandrel. A method as in any above, where the sidewall image transfer process comprises: depositing a film of oxide material and etching the oxide material to remove an oxide layer from a top surface of the mandrel and from other horizontal surfaces, where the etching results in formation of at least one oxide spacer having a desired shape of the microstructure, where the etching of the oxide material further results in removal of a total thickness of the SiARC2 and removal of a portion of the SiARC1, where the removed portion of the SiARC1 has a thickness less than the total thickness of the SiARC1. A method as in any above, where a thickness of the SiARC1 is greater than a thickness of the SiARC2. A method as in any above, where producing the at least one microstructure further comprises: after the etching, removing a remaining portion of the PL2, performing another etching to remove exposed portions of the SiARC1, removing exposed portions of the PL1, and patterning the substrate to form the at least one microstructure by using the at least one oxide spacer, a portion of the SiARC1 beneath the at least one oxide spacer and a portion of the PL1 beneath the at least one oxide spacer as a mask, where the at least one microstructure comprises a portion of the substrate.

A method as in any above, where forming the sacrificial mandrel further comprises removing the SiARC2 prior to producing the at least one microstructure by using the sacrificial mandrel in the sidewall image transfer process. A method as in any above, where removing the SiARC2 further comprises removing a total thickness of the SiARC2 and removing a portion of the SiARC1, where the removed portion of the SiARC1 has a thickness less than the total thickness of the SiARC1. A method as in any above, where the sidewall image transfer process comprises: depositing a film of oxide material and etching the oxide material to remove an oxide layer from a top surface of the mandrel and from other horizontal surfaces, where the etching results in formation of at least one oxide spacer having a desired shape of the microstructure. A method as in any above, where producing the at least one microstructure further comprises: after the etching, removing a remaining portion of the PL2, performing another etching to remove exposed portions of the SiARC1, removing exposed portions of the PL1, and patterning the substrate to form the at least one microstructure by using the at least one oxide spacer, a portion of the SiARC1 beneath the at least one oxide spacer and a portion of the PL1 beneath the at least one oxide spacer as a mask, where the at least one microstructure comprises a portion of the substrate.

A method as in any above, where the at least one lithographic layer further comprises at least one layer of antireflective coating material. A method as in any above, where the substrate comprises: at least one hardmask layer, at least one silicon layer and at least one buried oxide layer. A method as in any above, where the PL (and/or the PL1 and/or the PL2) comprises an organic planarization layer or ODL. A method as in any above, further comprising one or more additional aspects of the exemplary embodiments of the invention as described herein.

Figure 25:
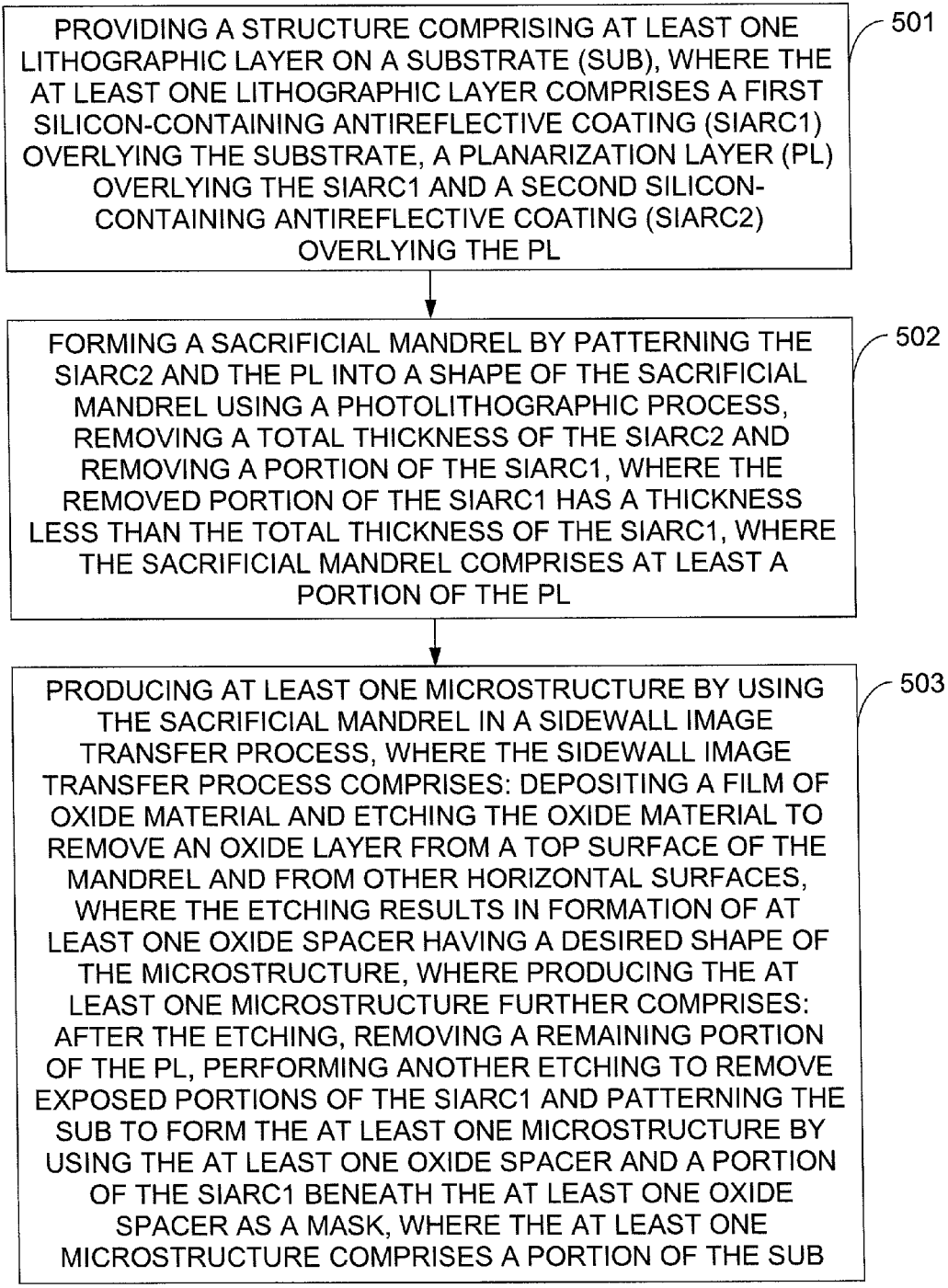
FIG. 25 shows a flowchart illustrating another non-limiting example of a method for practicing the exemplary embodiments of this invention.

(2) In another exemplary embodiment, and as shown in FIG. 25, a method comprising: providing a structure comprising at least one lithographic layer on a substrate, where the at least one lithographic layer comprises a first silicon-containing antireflective coating (SiARC1) overlying the substrate, a planarization layer (PL) overlying the SiARC1 and a second silicon-containing antireflective coating (SiARC2) overlying the PL (501); forming a sacrificial mandrel by patterning the SiARC2 and the PL into a shape of the sacrificial mandrel using a photolithographic process, removing a total thickness of the SiARC2 and removing a portion of the SiARC1, where the removed portion of the SiARC1 has a thickness less than the total thickness of the SiARC1, where the sacrificial mandrel comprises at least a portion of the PL (502); and producing at least one microstructure by using the sacrificial mandrel in a sidewall image transfer process, where the sidewall image transfer process comprises: depositing a film of oxide material and etching the oxide material to remove an oxide layer from a top surface of the mandrel and from other horizontal surfaces, where the etching results in formation of at least one oxide spacer having a desired shape of the microstructure, where producing the at least one microstructure further comprises: after the etching, removing a remaining portion of the PL, performing another etching to remove exposed portions of the SiARC1 and patterning the substrate to form the at least one microstructure by using the at least one oxide spacer and a portion of the SiARC1 beneath the at least one oxide spacer as a mask, where the at least one microstructure comprises a portion of the substrate (503). (See, e.g., FIGS. 1-8.)

A method as in any above, further comprising one or more additional aspects of the exemplary embodiments of the invention as described herein, including those noted above with respect to (1), as non-limiting examples.

Figure 26:
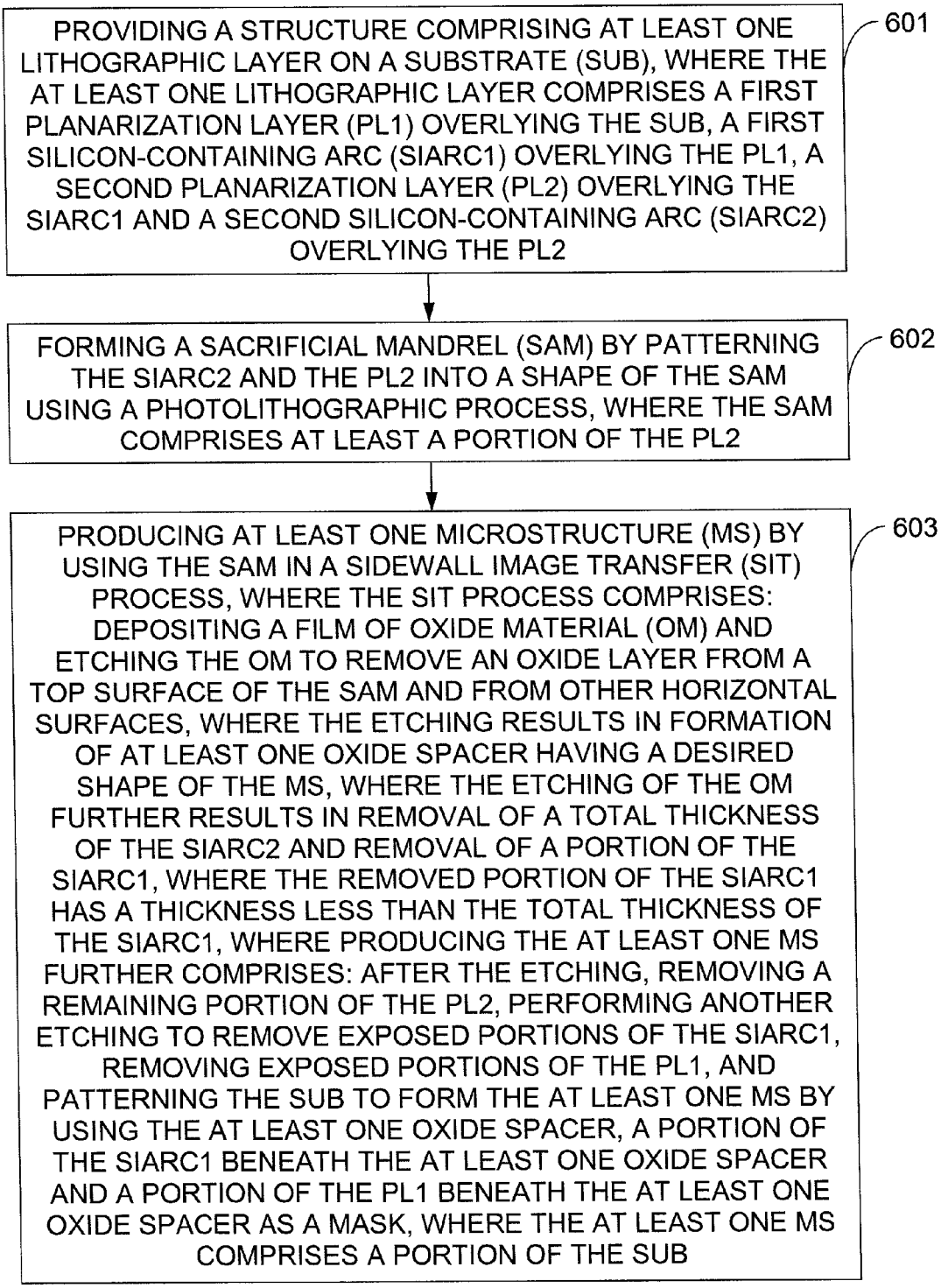
FIG. 26 illustrates a flowchart illustrating a further non-limiting example of a method for practicing the exemplary embodiments of this invention.

(3) In a further exemplary embodiment, and as shown in FIG. 26, a method comprising: providing a structure comprising at least one lithographic layer on a substrate, where the at least one lithographic layer comprises a first planarization layer (PL1) overlying the substrate, a first silicon-containing antireflective coating (SiARC1) overlying the PL1, a second planarization layer (PL2) overlying the SiARC1 and a second silicon-containing antireflective coating (SiARC2) overlying the PL2 (601); forming a sacrificial mandrel by patterning the SiARC2 and the PL2 into a shape of the sacrificial mandrel using a photolithographic process, where the sacrificial mandrel comprises at least a portion of the PL2 (602); and producing at least one microstructure by using the sacrificial mandrel in a sidewall image transfer process, where the sidewall image transfer process comprises: depositing a film of oxide material and etching the oxide material to remove an oxide layer from a top surface of the mandrel and from other horizontal surfaces, where the etching results in formation of at least one oxide spacer having a desired shape of the microstructure, where the etching of the oxide material further results in removal of a total thickness of the SiARC2 and removal of a portion of the SiARC1, where the removed portion of the SiARC1 has a thickness less than the total thickness of the SiARC1, where producing the at least one microstructure further comprises: after the etching, removing a remaining portion of the PL2, performing another etching to remove exposed portions of the SiARC1, removing exposed portions of the PL1, and patterning the substrate to form the at least one microstructure by using the at least one oxide spacer, a portion of the SiARC1 beneath the at least one oxide spacer and a portion of the PL1 beneath the at least one oxide spacer as a mask, where the at least one microstructure comprises a portion of the substrate (603). (See, e.g., FIGS. 13-17.)

A method as in any above, further comprising one or more additional aspects of the exemplary embodiments of the invention as described herein, including those noted above with respect to (1), as non-limiting examples.

Figure 27:
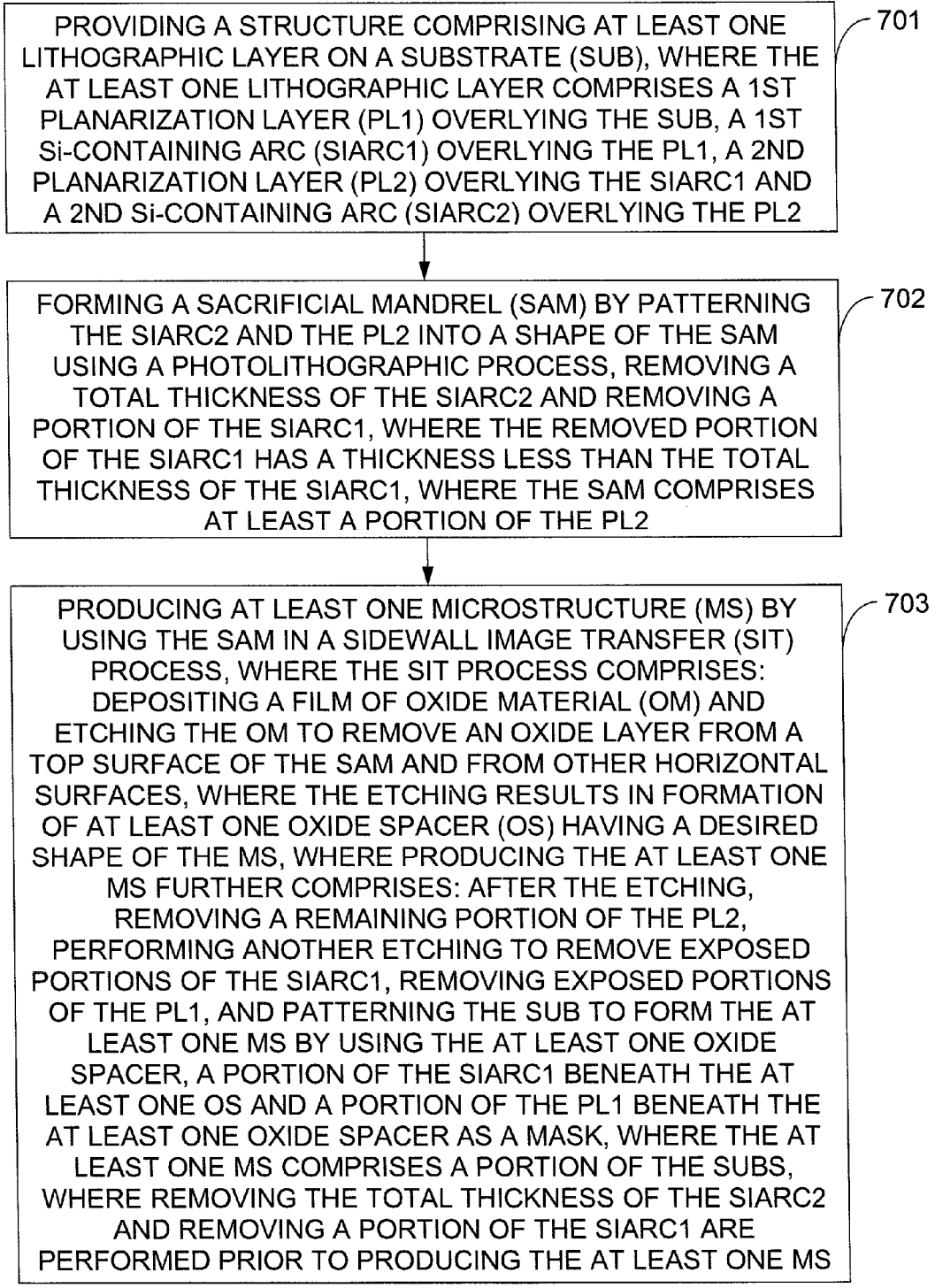
FIG. 27 depicts a flowchart illustrating another non-limiting example of a method for practicing the exemplary embodiments of this invention.

(4) In another exemplary embodiment, and as shown in FIG. 27, a method comprising: providing a structure comprising at least one lithographic layer on a substrate, where the at least one lithographic layer comprises a first planarization layer (PL1) overlying the substrate, a first silicon-containing antireflective coating (SiARC1) overlying the PL1, a second planarization layer (PL2) overlying the SiARC1 and a second silicon-containing antireflective coating (SiARC2) overlying the PL2 (701); forming a sacrificial mandrel by patterning the SiARC2 and the PL2 into a shape of the sacrificial mandrel using a photolithographic process, removing a total thickness of the SiARC2 and removing a portion of the SiARC1, where the removed portion of the SiARC1 has a thickness less than the total thickness of the SiARC1, where the sacrificial mandrel comprises at least a portion of the PL2 (702); and producing at least one microstructure by using the sacrificial mandrel in a sidewall image transfer process, where the sidewall image transfer process comprises: depositing a film of oxide material and etching the oxide material to remove an oxide layer from a top surface of the mandrel and from other horizontal surfaces, where the etching results in formation of at least one oxide spacer having a desired shape of the microstructure, where producing the at least one microstructure further comprises: after the etching, removing a remaining portion of the PL2, performing another etching to remove exposed portions of the SiARC1, removing exposed portions of the PL1, and patterning the substrate to form the at least one microstructure by using the at least one oxide spacer, a portion of the SiARC1 beneath the at least one oxide spacer and a portion of the PL1 beneath the at least one oxide spacer as a mask, where the at least one microstructure comprises a portion of the substrate, where removing the total thickness of the SiARC2 and removing a portion of the SiARC1 are performed prior to producing the at least one microstructure (703). (See, e.g., FIGS. 18-23.)

A method as in any above, further comprising one or more additional aspects of the exemplary embodiments of the invention as described herein, including those noted above with respect to (1), as non-limiting examples.

The blocks shown in FIGS. 24-27 further may be considered to correspond to one or more functions and/or operations that are performed in conjunction with one or more components, circuits, chips, apparatus, processors, computer programs and/or function blocks. Any and/or all of the above may be implemented in any practicable solution or arrangement that enables operation in accordance with the exemplary embodiments of the invention as described herein. One of ordinary skill in the art will appreciate the various devices and techniques that may be utilized.

In addition, the arrangement of the blocks depicted in FIGS. 24-27 should be considered merely exemplary and non-limiting. It should be appreciated that the blocks shown in FIGS. 24-27 may correspond to one or more functions and/or operations that may be performed in any order (e.g., any suitable, practicable and/or feasible order) and/or concurrently (e.g., as suitable, practicable and/or feasible) so as to implement one or more of the exemplary embodiments of the invention. In addition, one or more additional functions, operations and/or steps may be utilized in conjunction with those shown in FIGS. 24-27 so as to implement one or more further exemplary embodiments of the invention.

That is, the exemplary embodiments of the invention shown in FIGS. 24-27 may be utilized, implemented or practiced in conjunction with one or more further aspects in any combination (e.g., any combination that is suitable, practicable and/or feasible) and are not limited only to the steps, blocks, operations and/or functions shown in FIGS. 24-27.

While described above in reference to a silicon-containing ARC (SiARC), the exemplary embodiments of the invention may be utilized in conjunction with other types of layers or materials. As a non-limiting example, other ARCs with different elements (e.g., a layer of inorganic ARC) may be utilized.

Unless described otherwise herein, "depositing" may include any now known or later developed techniques appropriate for the material to be deposited, including, but not limited to: CVD, low-pressure CVD (LPCVD), plasma-enhanced CVD (PECVD), semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), ALD, chemical oxidation, molecular beam epitaxy (MBE), plating or evaporation. Any references to "poly" or "poly silicon" should be understood to refer to polycrystalline silicon. Any references to a "lithographic layer," a "litho layer" or a "litho stack" should be understood to refer to one or more layers of material that are used in conjunction with a lithographic process. Generally, these litho layers are only used for the lithographic process(es) in question and are removed such that the final product does not include these layers.

Any use of the terms "connected," "coupled" or variants thereof should be interpreted to indicate any such connection or coupling, direct or indirect, between the identified elements. As a non-limiting example, one or more intermediate elements may be present between the "coupled" elements. The connection or coupling between the identified elements may be, as non-limiting examples, physical, electrical, magnetic, logical or any suitable combination thereof in accordance with the described exemplary embodiments. As non-limiting examples, the connection or coupling may comprise one or more printed electrical connections, wires, cables, mediums or any suitable combination thereof.

Generally, various exemplary embodiments of the invention can be implemented in different mediums, such as hardware, logic, special purpose circuits or any combination thereof. As a non-limiting example, some aspects (e.g., patterning, formation of various elements or aspects) may be implemented in software which may be run on a computing device, while other aspects may be implemented in hardware.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. However, all such and similar modifications will still fall within the scope of the teachings of the exemplary embodiments of the invention.

Furthermore, some of the features of the preferred embodiments of this invention could be used to advantage without the corresponding use of other features. As such, the foregoing description should be considered as merely illustrative of the principles of the invention, and not in limitation thereof.

What is claimed is:

1. A method, comprising:
providing a structure comprising at least one lithographic layer on a substrate, where the at least one lithographic layer comprises a planarization layer (PL) and first and second silicon-containing layers, where the PL does not comprise photoresist;
forming a sacrificial mandrel by patterning and removing the second silicon-containing layer, removing at least a portion of the PL, and removing a portion of the first silicon-containing layer around a remaining portion of the PL using a photolithographic process, where the sacrificial mandrel comprises at least a portion of the PL, wherein the portion of the first silicon-containing layer removed has a thickness that is about or greater than the thickness of the second silicon-containing layer and less than the total thickness of the first silicon-containing layer; and
producing at least one microstructure by using the sacrificial mandrel in a sidewall image transfer process.

2. The method of claim 1, where the first silicon-containing layer comprises a first silicon-containing antireflective coating (SiARC1) overlying the substrate, the PL overlies the SiARC1, and the second silicon-containing layer comprises a second silicon-containing antireflective coating (SiARC2) overlying the PL.

3. The method of claim 2, where forming the sacrificial mandrel comprises patterning the SiARC2 and the PL into a shape of the sacrificial mandrel and removing the SiARC2.

4. The method of claim 3, where removing the SiARC2 further comprises removing a total thickness of the SiARC2, removing a first portion of the SiARC1, and leaving a second portion of the SiARC1 around the PL shaped into the sacrificial mandrel, where the removed first portion of the SiARC1 has a thickness less than the total thickness of the SiARC1.

5. The method of claim 3, where a thickness of the SiARC1 is greater than a thickness of the SiARC2.

6. The method of claim 5, where the SiARC1 has a thickness of about 70 nanometers and the SiARC2 has a thickness of about 35 nanometers.

7. The method of claim 3, where the sidewall image transfer process comprises: depositing a film of oxide material and etching the oxide material to remove an oxide layer from a top surface of the mandrel and from other horizontal surfaces, where the etching results in formation of at least one oxide spacer having a desired shape of the microstructure.

8. The method of claim 7, where producing the at least one microstructure further comprises: after the etching, removing a remaining portion of the PL and performing another etching to remove exposed portions of the SiARC1.

9. The method of claim 8, where producing the at least one microstructure further comprises: patterning the substrate to form the at least one microstructure by using the at least one oxide spacer and a portion of the SiARC1 beneath the at least one oxide spacer as a mask, where the at least one microstructure comprises a portion of the substrate.

10. The method of claim 1, where the PL comprises a second planarization layer (PL2), where the least one lithographic layer comprises a first planarization layer (PL1) overlying the substrate, the first silicon-containing layer comprises a first silicon-containing antireflective coating (SiARC1) overlying the PL1, the PL2 overlying the SiARC1, and the second silicon-containing layer comprises a second silicon-containing antireflective coating (SiARC2) overlying the PL2.

11. The method of claim 10, where forming the sacrificial mandrel comprises patterning the SiARC2 and the PL2 into a shape of the sacrificial mandrel.

12. The method of claim 11, where the sidewall image transfer process comprises: depositing a film of oxide material and etching the oxide material to remove an oxide layer from a top surface of the mandrel and from other horizontal surfaces, where the etching results in formation of at least one oxide spacer having a desired shape of the microstructure, where the etching of the oxide material further results in removal of a total thickness of the SiARC2 and removal of a portion of the SiARC1, where the removed portion of the SiARC1 has a thickness less than the total thickness of the SiARC1.

13. The method of claim 12, where a thickness of the SiARC1 is greater than a thickness of the SiARC2.

14. The method of claim 12, where producing the at least one microstructure further comprises: after the etching, removing a remaining portion of the PL2, performing another etching to remove exposed portions of the SiARC1, removing exposed portions of the PL1, and patterning the substrate to form the at least one microstructure by using the at least one oxide spacer, a portion of the SiARC1 beneath the at least one oxide spacer and a portion of the PL1 beneath the at least one oxide spacer as a mask, where the at least one microstructure comprises a portion of the substrate.

15. The method of claim 11, where forming the sacrificial mandrel further comprises removing the SiARC2 prior to producing the at least one microstructure by using the sacrificial mandrel in the sidewall image transfer process.

16. The method of claim 15, where removing the SiARC2 further comprises removing a total thickness of the SiARC2 and removing a portion of the SiARC1, where the removed portion of the SiARC1 has a thickness less than the total thickness of the SiARC1.

17. The method of claim 15, where the sidewall image transfer process comprises: depositing a film of oxide material and etching the oxide material to remove an oxide layer from a top surface of the mandrel and from other horizontal surfaces, where the etching results in formation of at least one oxide spacer having a desired shape of the microstructure.

18. The method of claim 17, where producing the at least one microstructure further comprises: after the etching, removing a remaining portion of the PL2, performing another etching to remove exposed portions of the SiARC1, removing exposed portions of the PL1, and patterning the substrate to form the at least one microstructure by using the at least one oxide spacer, a portion of the SiARC1 beneath the at least one oxide spacer and a portion of the PL1 beneath the at least one oxide spacer as a mask, where the at least one microstructure comprises a portion of the substrate.

19. The method of claim 1, where the at least one lithographic layer further comprises at least one layer of antireflective coating material.

20. The method of claim 1, where the substrate comprises: at least one hardmask layer, at least one silicon layer and at least one buried oxide layer.

* * * * *